United States Patent
Fenk

[11] Patent Number: 6,091,306
[45] Date of Patent: Jul. 18, 2000

[54] CIRCUIT CONFIGURATION WITH MAIN AND SUBORDINATE OSCILLATORS

[75] Inventor: Josef Fenk, Eching, Germany

[73] Assignee: Siemens Aktiengesellschaft, Munich, Germany

[21] Appl. No.: 09/151,965

[22] Filed: Sep. 11, 1998

[30] Foreign Application Priority Data

Sep. 11, 1997 [DE] Germany .................. 197 40 001

[51] Int. Cl.[7] ........................................ H03L 7/00
[52] U.S. Cl. ........................ 331/47; 331/12; 331/19; 331/50; 331/51; 455/255; 455/258; 455/259; 455/260; 455/263; 455/264; 329/304; 329/308
[58] Field of Search ........................... 331/47, 12, 19, 331/50, 51; 455/255, 258, 259, 263, 264, 260; 329/304, 306, 307, 308; 327/105

[56] References Cited

U.S. PATENT DOCUMENTS

| | | | |
|---|---|---|---|
| 3,626,315 | 12/1971 | Stirling et al. ........................ | 331/19 |
| 3,694,766 | 9/1972 | Boelke .................................. | 331/11 |
| 4,001,714 | 1/1977 | Reed .................................... | 331/4 |

FOREIGN PATENT DOCUMENTS 0643494  3/1995  European Pat. Off. .

Primary Examiner—Robert Pascal
Assistant Examiner—Kimberly Glenn
Attorney, Agent, or Firm—Herbert L. Lerner; Laurence A. Greenberg; Werner H. Stemer

[57] ABSTRACT

Parasitic feedback is prevented in a transmitter, a modulator, or a demodulator from having an interfering influence on the circuit section that generates the mixed frequency. The circuit has a main oscillator and a subordinate oscillator connected downstream of the main oscillator. The main oscillator generates a signal having an $x^{th}$ harmonic that serves to excite the subordinate oscillator. Furthermore, a frequency divider is connected downstream of the subordinate oscillator. The frequency divider divides the frequency of an output signal of the subordinate oscillator by an integer divider value. The divider value differs from the value x.

10 Claims, 5 Drawing Sheets

CIRCUIT CONFIGURATION WITH MAIN AND SUBORDINATE OSCILLATORS

BACKGROUND OF THE INVENTION

1. Field of the Invention

The invention lies in the electronics field. Specifically, the invention pertains to a circuit configuration that can be employed either for a modulator, a demodulator, a down-converter, or else, for example, for an output amplifier.

2. Description of the Related Art

U.S. Pat. No. 5,530,929 to Lindqvist et al., which largely corresponds to published European patent application EP 0 643 494 A1, discloses a homodyne radio receiver. Such a receiver is illustrated in FIG. 1. A signal received by an antenna 12 is filtered through a bandpass filter 15. The bandpass filter 15 serves to select the correct communications band. An amplifier 16 is connected downstream of the bandpass filter 15. A high gain leads to high sensitivity and a low gain is desirable if a good dynamic range and a clean intermodulation characteristic are to be achieved. The output signal of the amplifier 16 is split into two signal components and fed to a respective mixer 11 and 11'. A local oscillator LO, which oscillates at a frequency fLo, is connected to a multiplier 13. The multiplier 13 multiplies the frequency fLo by a multiplication factor M (preferably M=3). The frequency M·fLo is subsequently divided by an integer factor N (preferably N=2). The signal generated as a result, having the frequency M: N·fLo, is fed to a phase shifter 19, which generates from this an in-phase signal (phase shift=0°) and a quadrature signal (phase shift=90°). These signals are additionally fed to the mixers 11 and 11'. The mixers 11 and 11' convert the radio-frequency input signal into an in-phase baseband signal I' and a quadrature baseband signal Q', respectively. The mixers 11 and 11' may be active or passive circuit elements. Low-pass filters 17 and 17' and amplifiers 18 and 18' are connected downstream of the mixers 11 and 11' in order to filter out and amplify the desired signal component. One disadvantage of that embodiment is that the local oscillator LO is not integrated in a chip.

SUMMARY OF THE INVENTION

It is accordingly an object of the invention to provide a circuit configuration, which overcomes the above-mentioned disadvantages of the prior known devices and methods of this general type.

With the foregoing and other objects in view there is provided, in accordance with the invention, a circuit configuration, comprising:
a main oscillator having an input and an output;
a subordinate oscillator connected to the output of the main oscillator and generating an output signal with a given frequency;
the main oscillator generating a signal with an $x^{th}$ harmonic serving to excite the subordinate oscillator; and a divider connected to the subordinate oscillator and dividing the given frequency of the output signal of the subordinate oscillator by an integer divider value that is different from x.

In other words, there is provided a main oscillator and a subordinate oscillator connected downstream of the main oscillator. The main oscillator generates a signal which contains an $x^{th}$ harmonic. The harmonic is used to excite the subordinate oscillator. Furthermore, a divider is provided which is connected to the subordinate oscillator and divides the frequency of the output signal of the subordinate oscillator by an integer divider value that differs from the value x.

In accordance with an added feature of the invention, a first feedback path compares the output signal of the subordinate oscillator with a reference signal, generates a control signal, and feeds the control signal to the subordinate oscillator.

In accordance with an additional feature of the invention, the first feedback path includes a frequency divider for dividing the given frequency of the output signal of the subordinate oscillator and having an output outputting a divided frequency, and which further comprises:
a frequency comparator having an input connected to the output of the frequency divider, the frequency comparator comparing the divided frequency with a reference frequency and outputting a desired value at an output thereof; and
a converter for converting the desired value into a control signal, the converter having an input connected to the output of the frequency comparator and an output connected to the subordinate oscillator.

In accordance with another feature of the invention, the first feedback path is opened and the main oscillator is connected to the subordinate oscillator as soon as the given frequency of the output signal generated by the subordinate oscillator lies in a capture range of the main oscillator.

In accordance with a further feature of the invention, a second feedback path compares an output signal of the main oscillator with a further reference signal and determines therefrom a main oscillator control signal. The second feedback path is connected to feed the main oscillator control signal to the main oscillator.

In accordance with again an added feature of the invention, a modulator is connected to the output of the subordinate oscillator. Alternatively, demodulator, down-converter, or an output amplifier is connected to the output of the subordinate oscillator.

The circuit elements of the circuit configuration according to the invention are advantageously integrated in a chip.

Other features which are considered as characteristic for the invention are set forth in the appended claims.

Although the invention is illustrated and described herein as embodied in a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
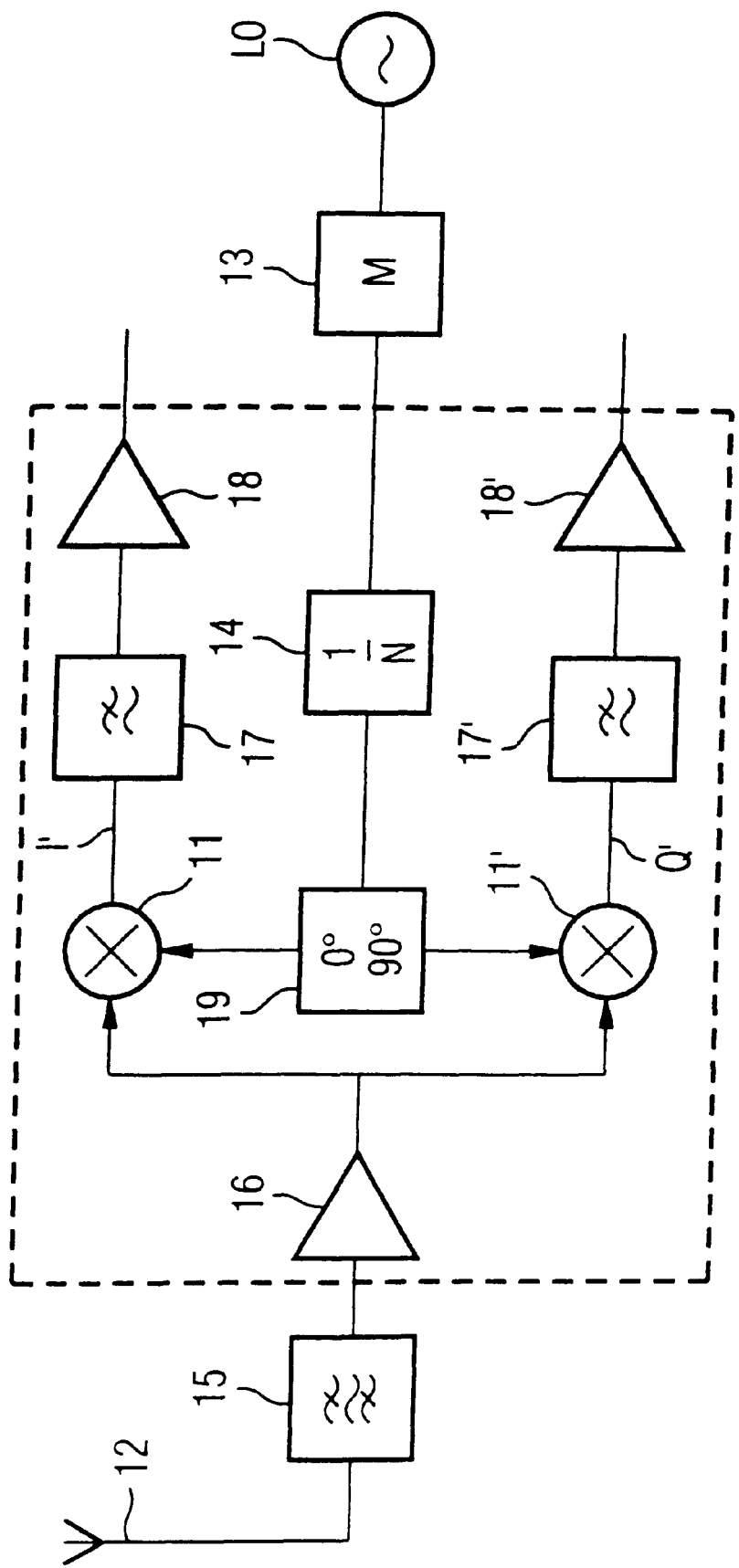
FIG. 1 shows a block circuit diagram of a homodyne receiver according to the prior art.

A description of the prior art circuit of FIG. 1 appears in the description of the related art in the above introduction.

Figure 2:
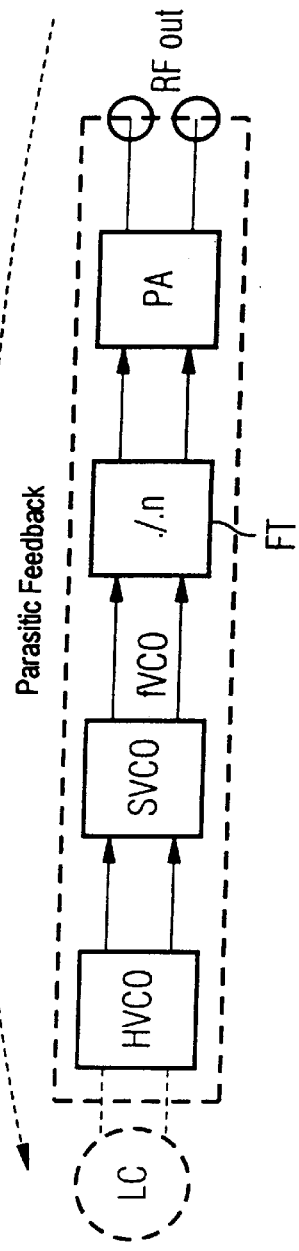
FIG. 2 is a block diagram of a first application of the circuit configuration according to the invention in an offset transmitter.

Referring now more specifically to the figures of the drawing illustrating the invention and first, particularly, to FIG. 2 thereof, there is seen an offset transmitter with an LC resonant circuit which serves to set the oscillation frequency of a voltage-controlled oscillator HVCO. The voltage-controlled oscillator HVCO, also referred to as the main oscillator in the following text, generates not only the fundamental frequency but also harmonics. One of the harmonics, for example the $x^{th}$ harmonic, is utilized for controlling a subordinate oscillator SVCO. Owing to the balanced arrangement, the main oscillator HVCO preferably generates odd-numbered harmonics. The subordinate oscillator SVCO generates an output signal whose fundamental frequency corresponds to the $x^{th}$ harmonic of the main oscillator HVCO. The signal generated by the subordinate oscillator SVCO and having the frequency fVCO is fed to a frequency divider FT, which divides the frequency fVCO by a divider value n. In this case, the divider value n is to be chosen such that if the subordinate oscillator SVCO oscillates at an even-numbered harmonic of the main oscillator HVCO, the divider value is odd and the divider value n is even if the subordinate oscillator SVCO oscillates at a frequency fVCO which is an odd-numbered harmonic of the frequency of the main oscillator HVCO. The signal generated in this way and having the frequency fVCO : n at the output of the frequency divider FT is fed to an output amplifier PA. A transmission signal RFout is available at the output of the output amplifier.

The circuit configuration described prevents parasitic feedback of the transmission signal RFout from being able to directly interfere with the fundamental frequency of the main oscillator HVCO.

In FIG. 2, the circuit elements of main oscillator HVCO, subordinate oscillator SVCO, frequency divider FT and output amplifier PA are integrated on a chip. The dotted rectangle indicates the chip boundary. It goes without saying that it is also possible to integrate the LC network in the module.

The oscillator signal generated by the main oscillator HVCO is a balanced signal.

The frequency divider FT may be implemented for example in the form of an asynchronous divider chain (Johnson counter) with, say, a divider value n=2, 4 or higher.

The modulated output signal RFout is unable, despite the parasitic feedback, to have any interfering influence on the main oscillator HVCO since the resonant oscillation frequency of the main oscillator HVCO and the selection properties thereof attenuate the degree of perturbation. Since the output signal of the main oscillator HVCO is substantially greater than the output signal RFout that is parasitically fed back, the subordinate oscillator SVCO follows the main oscillator HVCO.

Due to use of a balanced active circuit as the main oscillator HVCO, the even-numbered harmonics are suppressed very well and the odd-numbered harmonics largely follow the profile of a square-wave oscillation. In other words, the third harmonic has a separation of approximately 10 dB from the first harmonic. This harmonic is used to tune the free-running subordinate oscillator SVCO, which is approximately tuned to the operating frequency, to the third harmonic. In the subordinate oscillator SVCO, the fundamental of the main oscillator HVCO is sufficiently well suppressed, so that the divider chain is driven with a fundamental signal that is suppressed by 20 dB. This applies, in principle, to all of the circuits shown.

Figure 3:
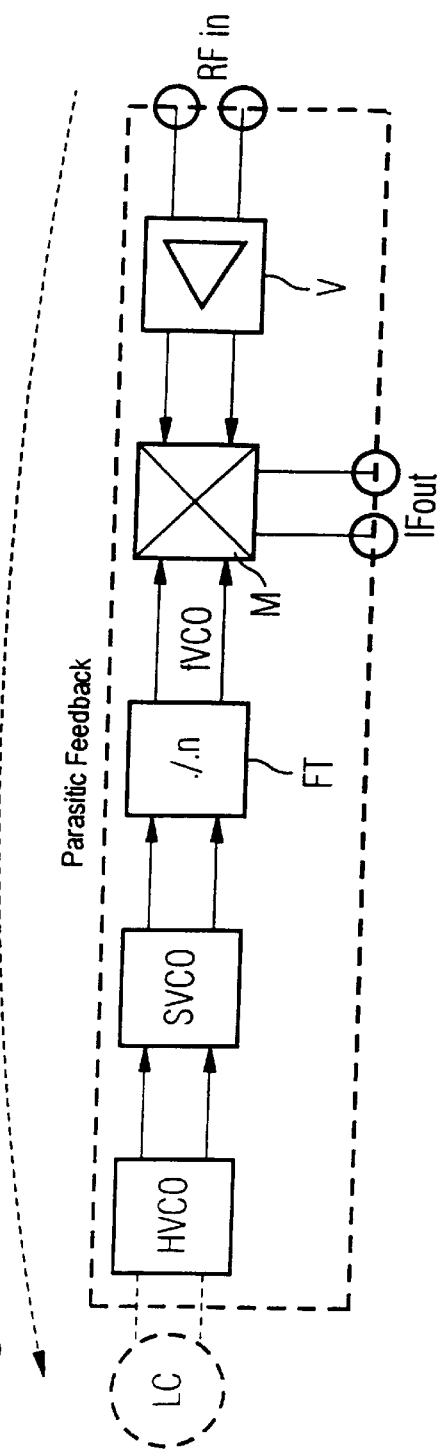
FIG. 3 is a block diagram of a second application of the circuit configuration according to the invention in conjunction with a mixer.

The circuit configuration shown in FIG. 3 serves as a mixer at very low IF frequency. A radio signal RFin is first amplified by an amplifier V. The amplified signal is passed to a mixer M, which additionally receives the signal at the frequency fVCO and mixes these to form an output signal IFout.

In terms of the method of operation, there is no difference from the circuit elements, shown in FIG. 2, of LC resonant circuit, main oscillator HVCO, subordinate oscillator SVCO and frequency divider FT with the divisor n.

The down-conversion in the circuit configuration shown in FIG. 3 can be effected right down to the same frequency as the input signal. This is advantageous for example if it were desired to employ IF sampling arranged downstream of the mixer.

Figure 4:
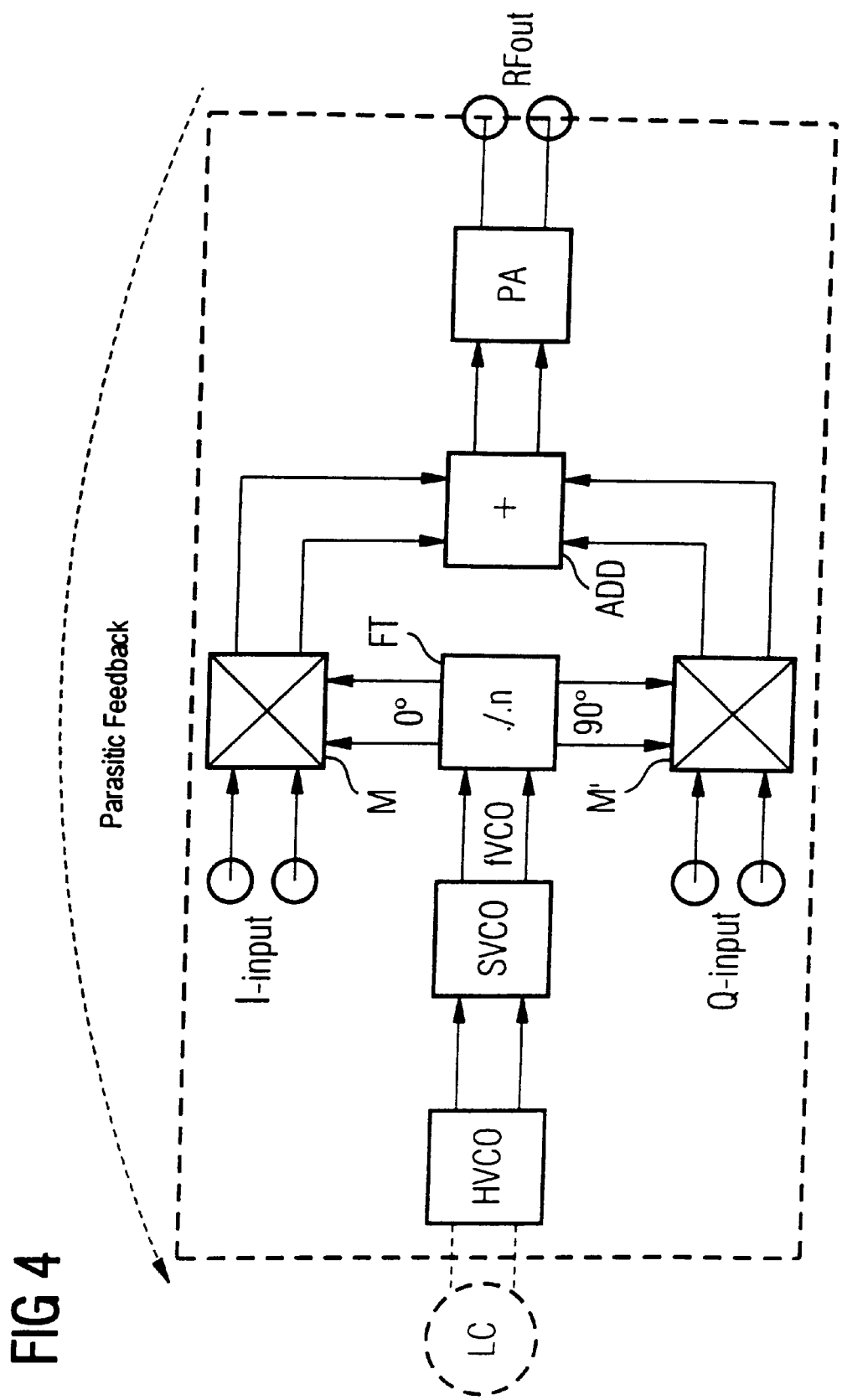
FIG. 4 is a block diagram of a third application of the circuit configuration according to the invention as an I/Q direct modulator.

The circuit configuration shown in FIG. 4 serves for I/Q direct modulation. The circuit elements of LC resonant circuit, main oscillator HVCO, subordinate oscillator SVCO and frequency divider FT correspond to the elements already described above. In addition, the frequency divider FT in FIG. 4 has a phase shifter which splits the signal divided by n and having the frequency fVCO into an I component (phase shift=00) and a Q component (phase shift=90°). The I component is mixed with an in-phase input signal I-input by means of the mixer M and passed to an adder ADD. The Q component is mixed with a quadrature input signal Q-input by means of the mixer M' and likewise fed to the adder ADD. Connected downstream of the adder ADD is an output amplifier PA, at whose output terminals the output signal RFout is present.

In the case of the vector modulation shown in FIG. 4, just as in the case of the other circuit configurations, parasitic feedback does not lead to an interfering influence on the main oscillator HVCO.

If an asynchronous divider is used as the frequency divider FT, then the requisite 0° and 90° for the I component and Q component, respectively, are available in a simple manner.

Figure 5:
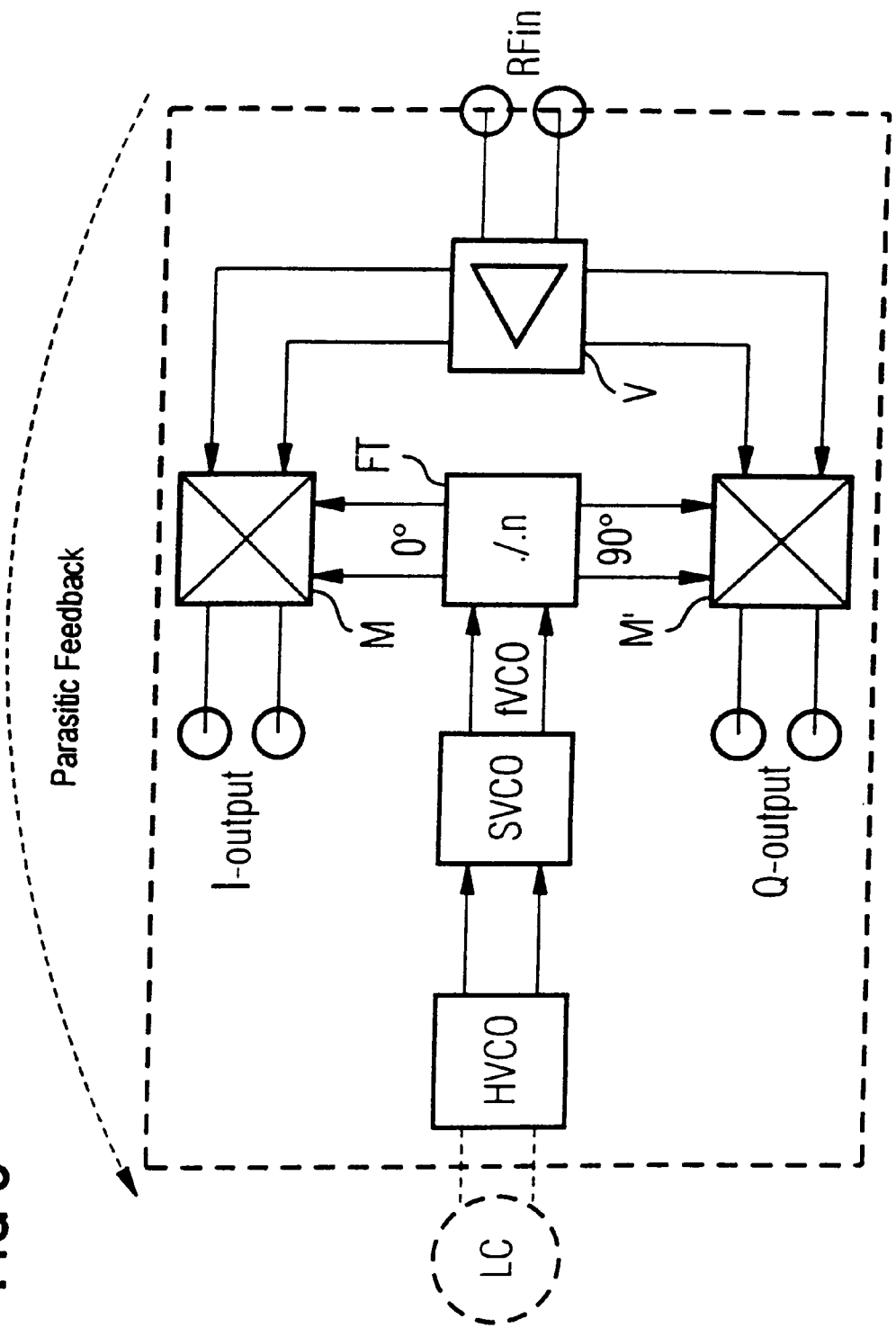
FIG. 5 is a block diagram of a fourth application of the circuit configuration according to the invention as an I/Q direct demodulator.

The circuit configuration in FIG. 5 differs from that shown in FIG. 4 by the fact that the adder ADD and the output amplifier PA are replaced by an input amplifier V, at whose inputs the input signal RFin is present. The circuit configuration serves for I/Q direct modulation according to the homodyne concept. The signal generated by the input amplifier V is fed to the two mixers M and M' and mixed with the I component and Q component, respectively, which originate from the frequency divider FT, and can be picked off at the outputs of the two mixers M and M' as in-phase output signal I-output and quadrature output signal Q-output, respectively. In this case, too, parasitic feedback does not lead to interference at the main oscillator HVCO. In the same way as in FIG. 4, the I and Q components are available by using an asynchronous divider as the frequency divider FT.

Figure 6:
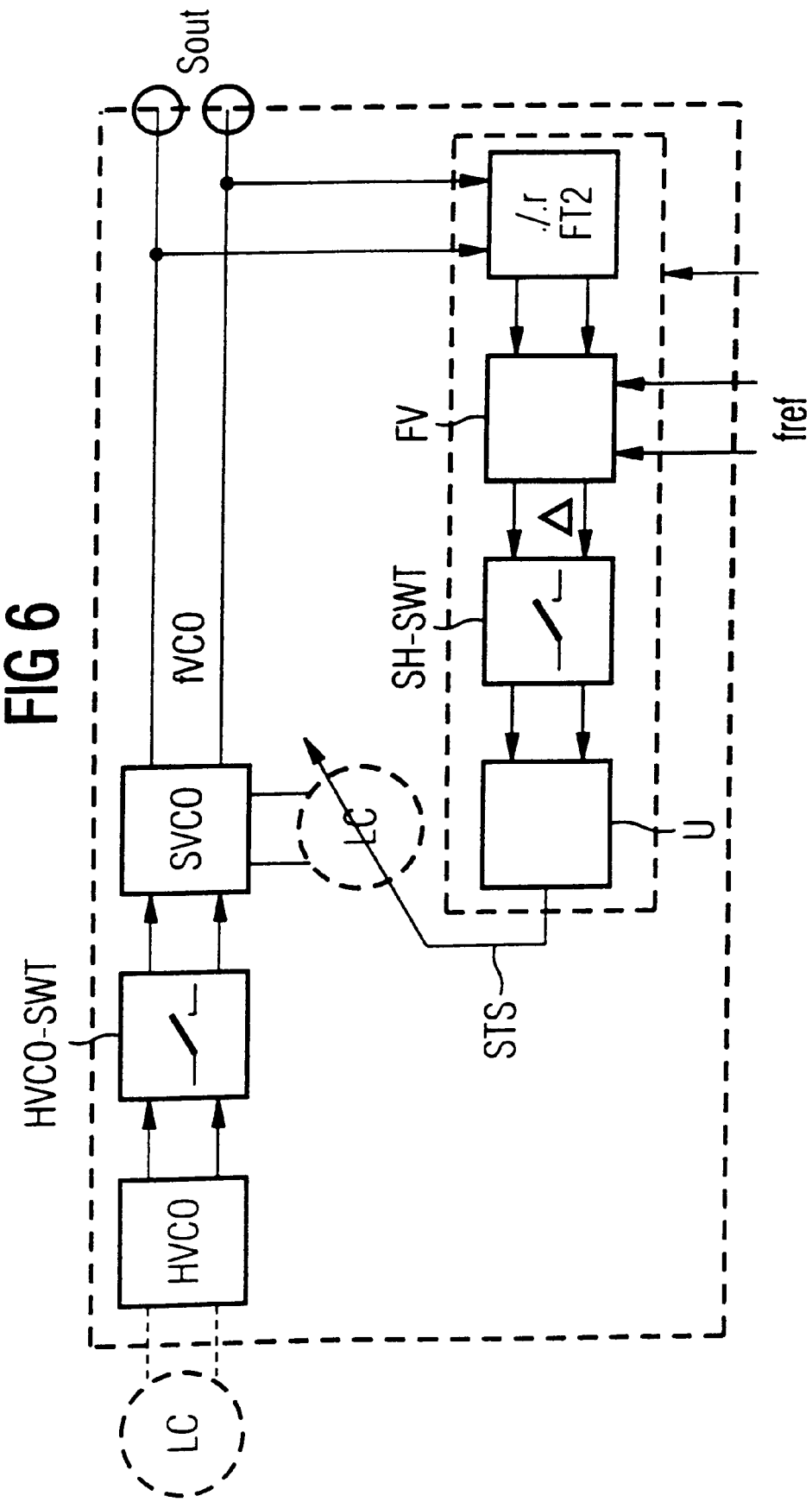
FIG. 6 is a block diagram of a part of the circuit configuration according to the invention which serves to generate the oscillator output signal.

In the exemplary embodiment shown in FIG. 6, a feedback path is provided which picks off the output signal Sout of the subordinate oscillator SVCO and feeds it to a frequency divider FT2. There it is divided by a divider value r and fed to a frequency comparator FV. The frequency comparator FV compares the frequency that has been divided by the divider value r, fVCO : r, with a reference frequency fref and outputs a desired value Δ to a sample-and-hold switch SH-SWT. If the sample-and-hold switch SH-SWT is closed, the desired value Δ is converted by a converter U into a control signal STS. The converter U controls the frequency until the frequency error Δ is minimal. The control signal STS acts on the LC resonant circuit of the subordinate oscillator SVCO. Furthermore, an RF signal path switch HVCO-SWT is provided which is connected between the main oscillator HVCO and the subordinate oscillator SVCO. The RT signal path switch HVCO-SWT optionally forwards the signal originating from the main oscillator HVCO to the subordinate oscillator SVCO.

The just-described control loop operates until the frequency fVCO of the subordinate oscillator SVCO is coarsely set. Afterward the feedback path is opened and the main oscillator HVCO is connected to the subordinate oscillator SVCO, in order to set the frequency fVCO of the subordinate oscillator SVCO exactly.

The frequency comparator FV is fed with an external reference signal at the reference frequency fref which originates from an external quartz crystal. The converter U may be, for example, a pulse-length-to-current converter or a pulse-length-to-voltage converter.

A sample-and-hold operation is involved here in the frequency setting of the subordinate oscillator SVCO. Alternatively, the frequency could also be set by means of a sample-and-hold PLL (Phase Locked Loop). Since less stringent requirements are made of the accuracy in the first control loop, the frequency fVCO can be determined by a counter.

In addition to the control loop, shown in FIG. 6, for setting the frequency fVCO of the subordinate oscillator SVCO, it is possible to provide a further control loop for setting the operating frequency of the main oscillator HVCO.

A common feature of FIGS. 2 to 6 is that the dotted rectangle identifies the circuit elements integrated on a chip. However, the LC resonant circuit drawn outside the dotted rectangle may also readily be integrated in the chip.

A common feature of FIGS. 2 to 5 is that the main oscillator HVCO and the subordinate oscillator SVCO are connected up, in principle, in accordance with the arrangement as shown in FIG. 6.

Alternatively, the device for frequency tracking which has the frequency divider FT2, the frequency comparator FV, the converter U and, at the output of the converter U, the control signal STS and which, in FIG. 6, drives the LC resonant circuit of the subordinate oscillator SVCO could have a control signal STS that is fed in externally applied to it.

If the RF signal path switch HVCO-SWT is open, the sample-and-hold switch SH-SWT is simultaneously closed. This corresponds to the sample mode. In the hold mode, the RF signal path switch HVCO-SWT is closed and the sample-and-hold switch SH-SWT is open.

We claim:

1. A circuit configuration, comprising:
   a main oscillator having an input and an output;
   a subordinate oscillator connected to the output of said main oscillator and generating an output signal with a given frequency;
   said main oscillator generating a signal with an $x^{th}$ harmonic serving to excite said subordinate oscillator;
   a divider connected to said subordinate oscillator and dividing the given frequency of the output signal of said subordinate oscillator by an integer divider value that is different from x;
   a first feedback path comparing the output signal of said subordinate oscillator with a reference signal, generating a control signal, and feeding the control signal to said subordinate oscillator, said first feedback path including a frequency divider for dividing the given frequency of the output signal of said subordinate oscillator and having an output outputting a divided frequency;
   a frequency comparator having an input connected to said output of said frequency divider, said frequency comparator comparing the divided frequency with a reference frequency and outputting a desired value at an output thereof; and
   a converter for converting the desired value into a control signal, said converter having an input connected to the output of said frequency comparator and an output connected to said subordinate oscillator.

2. The circuit configuration according to claim 1, which further comprises a first feedback path comparing the output signal of said subordinate oscillator with a reference signal, generating a control signal, and feeding the control signal to said subordinate oscillator.

3. The circuit configuration according to claim 2, wherein said first feedback path includes a frequency divider for dividing the given frequency of the output signal of said subordinate oscillator and having an output outputting a divided frequency, and which further comprises:
   a frequency comparator having an input connected to said output of said frequency divider, said frequency comparator comparing the divided frequency with a reference frequency and outputting a desired value at an output thereof; and
   a converter for converting the desired value into a control signal, said converter having an input connected to the output of said frequency comparator and an output connected to said subordinate oscillator.

4. The circuit configuration according to claim 1, wherein said first feedback path is opened and said main oscillator is connected to said subordinate oscillator as soon as the given frequency of the output signal generated by said subordinate oscillator is in a capture range of said main oscillator.

5. The circuit configuration according to claim 4, which further comprises a second feedback path for comparing an output signal of said main oscillator with a further reference signal and for determining therefrom a main oscillator control signal, said second feedback path being connected to feed the main oscillator control signal to said main oscillator.

6. The circuit configuration according to claim 1, which further comprises a second feedback path for comparing an output signal of said main oscillator with a further reference signal and for determining therefrom a main oscillator control signal, said second feedback path being connected to feed the main oscillator control signal to said main oscillator.

7. The circuit configuration according to claim 1, which further comprises a modulator connected to said output of said subordinate oscillator.

8. The circuit configuration according to claim 1, which further comprises a demodulator connected to said output of said subordinate oscillator.

9. The circuit configuration according to claim 1, which further comprises a down-converter connected to said output of said subordinate oscillator.

10. The circuit configuration according to claim 1, which further comprises an output amplifier connected to said output of said subordinate oscillator.

\* \* \* \* \*